Figure 3:
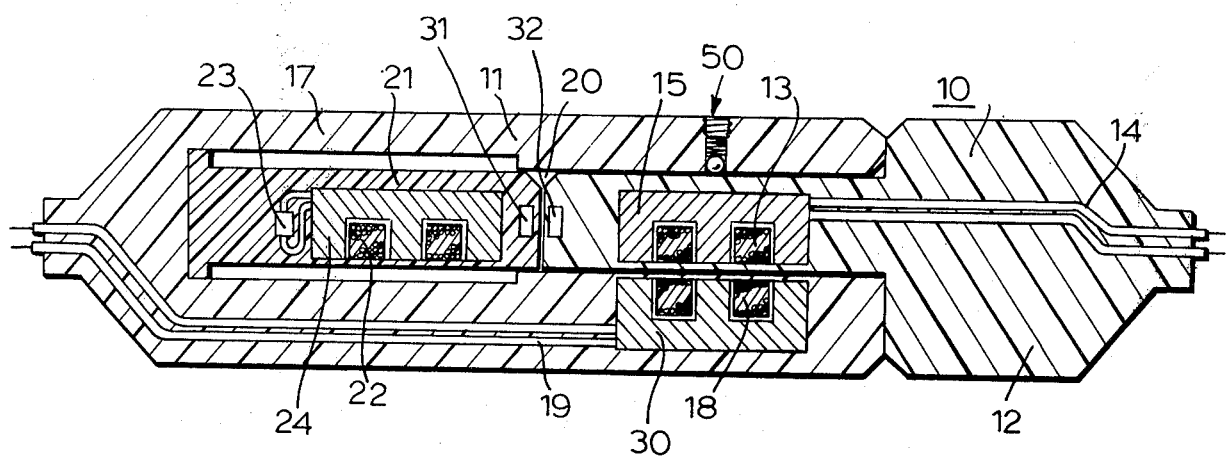

United States Patent [19]
Weston

[11] 3,995,209
[45] Nov. 30, 1976

[54] INDUCTIVE CONNECTORS

[75] Inventor: John Anthony David Weston, St. John's, Canada

[73] Assignee: Pelcon Limited, St. John's, Canada

[22] Filed: Dec. 22, 1975

[21] Appl. No.: 642,912

[30] Foreign Application Priority Data
Jan. 8, 1975 United Kingdom.................. 834/75

[52] U.S. Cl. ............................ 323/44 R; 323/60; 336/DIG. 2
[51] Int. Cl.² ...................... G05F 3/00; H01F 27/00
[58] Field of Search................ 336/83, DIG. 2, 170; 333/32, 22 R, 7; 320/2; 323/44 R, 60

[56] References Cited
UNITED STATES PATENTS 3,529,264  9/1970  Lancaster .............................. 333/7
3,550,682  12/1970  Fowler .......................... 336/DIG. 2

Primary Examiner—Thomas J. Kozma
Attorney, Agent, or Firm—Sim & McBurney

[57]  ABSTRACT

An inductive connector has two coils which are inductively coupled when the two parts of the connector are "connected." Associated with one of the parts is a third coil which is movable, normally automatically, into inductively coupled relationship with the other coil of that part when the parts are separated. An impedance is connected in circuit with the third coil, whereby impedance matching with a source connected to the aforesaid other coil of that part can be achieved when the parts are separated.

20 Claims, 4 Drawing Figures

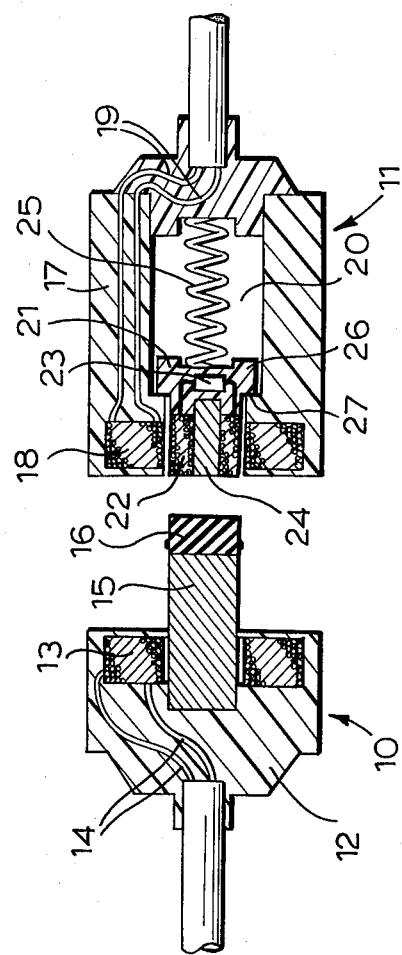
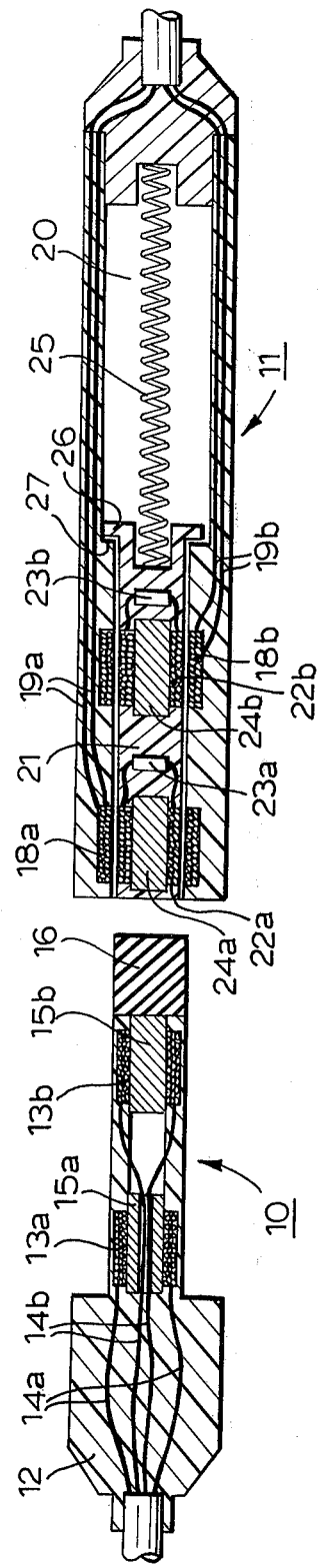
FIG.1
FIG.2

INDUCTIVE CONNECTORS

This invention relates to inductive connectors. More particularly, this invention relates to inductive connectors that are particularly suited for use in communications systems, although their use is not limited thereto, and which are provided with what could be referred to as a dummy load for impedance matching purposes.

All electrical connectors are characterized by at least two parts that are capable of being "connected" and "disconnected". Most electrical connectors are of a type that could be referred to as direct connectors. In a direct connector electrically conductive contacts of the two parts are brought into physical contact with each other when the connector is connected, thus establishing an electrically conductive path through the connector. Electrical connectors of the direct type are subject to one or more of the following disadvantages: arcing or sparking; contact corrosion, pitting or oxidation; inability to be used in explosive atmospheres or when surrounded by an electrically conductive medium such as water.

In order to obviate these disadvantages inductive connectors have been developed. In an inductive connector there is no direct transfer of electrical energy from one connector part to the other. Instead the electrical energy is inductively coupled from one connector part to the other in the same manner as in a transformer. One simple form of an inductive connector consists of a male connector part including a coil wound on or about a ferromagnetic core and a female connector part having an opening to receive the core, the opening having a coil surrounding the same.

Inductive connectors can be used in a conductive medium such as water and are useful in both power transmission and communications systems. However, prior art inductive connectors of which I am aware do present one problem when used in communications systems, that being a problem of impedance matching when various inductive connectors of the system are connected and disconnected. Consider, for example, a transmitter having twenty multiplexed output channels connected to various receivers. The output impedance of the transmitter will be matched to the input impedance of the receivers and the transmission line. If one or more of the inductive connectors is disconnected, an immediate impedance mismatch will result causing inferior or unacceptable system performance. The impedance mismatch results from the fact that when the two parts of one of the inductive connectors are disconnected, the impedance seen by the transmitter in the channel in which that connector is located changes to a low impedance inductive load.

In accordance with this invention there is provided an inductive connector which is provided with a dummy load to obviate the aforementioned impedance mismatching problem.

It should be noted that in British Pat. No. 1,366,134 published Sept. 11, 1974 there is disclosed an inductive connector and various systems for limiting the current in the primary circuit thereof when the two parts of the connector are disconnected. In one embodiment current limiting is achieved by having the primary winding connected in a circuit that is at least approximately tuned to the frequency of the supply when the parts of the connector are connected, but which is detuned by separation of the parts. In another embodiment the impedance of the primary circuit is kept from becoming too low when the connector parts are disconnected by the addition of a "keeper" to the primary magnetic circuit. This same approach is followed in British Pat. No. 392,052 accepted May 11, 1933. In both cases the systems and devices disclosed in these patents are concerned with limiting primary current, not with impedance matching.

More specifically, in accordance with one aspect of this invention there is provided an inductive connector comprising first and second cooperating and separable parts, said parts being movable into a first cooperating position in which electrical energy can be inductively coupled between said parts and being separable from each other to interrupt the flow of electrical energy between said parts, said first part including first and second coils, said second part including a third coil, said first and third coils being constructed and arranged such that when said parts are in said first position, said first and third coils are inductively coupled, said second coil being movable into a position where it is inductively coupled with said first coil when said parts are separated from each other, an impedance connected in electrical circuit with said second coil, and means associated with said second part for moving said second coil out of inductively coupled relationship with said first coil when said parts are moved to said first position.

Various embodiments of this invention are shown in the appended FIGS. 1 to 4 inclusive, these Figures being sections through inductive connectors embodying the invention.

Referring to FIG. 1, there is shown a bidirectional, automatically loaded, inductive connector. It includes a male part 10 and a female part 11. Both parts are generally cylindrical in configuration, but shape is not a critical factor.

Male part 10 includes a housing 12 of any suitable electrical insulating material which encapsulates, or in which is located a coil or winding 13. Coil 13 is connected to conductors 14 that are brought out of housing 12. Secured in housing 12 is a core 15 of ferromagnetic material. A ferrite core is particularly suitable. Coil 13 is wound about core 15. At one end of core 15 is a non-magnetic face cap 16.

Female part 11 includes a housing 17 of any suitable electrical insulating material which encapsulates, or in which is located a coil or winding 18. Coil 18 is connected to conductors 19 that are brought out of housing 17. An opening or cavity 20 is provided within housing 17, and coil 18 surrounds the portion of opening 20 at one end of housing 17.

Located within cavity 20 is a generally cylindrical plug 21 of electrically insulating material in which is located a coil or winding 22 that is connected to a resistor 23 or other load impedance also located in plug 21 so as to provide a dummy load. Coil 22 is wound about a ferromagnetic core 24 that is located or embedded in plug 21. Plug 21 is biased to the position shown in FIG. 1 by means of a spring 25, although other biasing arrangements could be used. Plug 21 is provided with a flange 26 that cooperates with a flange 27 provided on housing 17 to properly position the plug.

When the connector parts 10 and 11 are disconnected, as shown in FIG. 1, plug 21, under the influence of spring 25, assumes the position shown in FIG. 1. In this position coils 18 and 22 are inductively coupled and the transmitter (not shown) connected to conductors 19, rather than seeing a low impedance inductive load, as would be the case if the dummy load were not provided, sees a load impedance approximately equal to the product of the turns ratio of coils 18 and 22 and the value of resistor 23. By varying either the turns ratio or the value of impedance 23 this load impedance can be made identical to that which is seen by the transmitter when the two parts of the inductive connector are connected.

When the two parts 10 and 11 are connected, plug 21 is pushed to the rear of cavity 20 against spring 25 by the insertion of core 15 and face cap 16 into cavity 20. Coil 18 then surrounds core 15 and inductive coupling is achieved between coils 13 and 18 via core 15.

The connector of FIG. 1 is bidirectional because coils 13 and 18 both are spaced the same or about the same distance from core 15 when the connector is connected.

The embodiment of the invention shown in FIG. 2 is similar to that of FIG. 1 except that there are multiple coils 13a and 13b, 18a and 18b, 22a and 22b, multiple cores 15a and 15b, 24a and 24b, multiple conductors 14a and 14b, 19a and 19b, and multiple resistors 23a and 23b. In addition it will be noted that, when the connector parts are connected, coils 13a and 13b are interposed between coils 18a and 18b and cores 15a and 15b. The difference in spacing between cores 15a and b and coils 13a and b and coils 18a and b makes the connector of FIG. 2 a unidirectional connector in the sense that it is more efficient in coupling electrical energy in one direction (from male to female) than in the other direction.

It will be appreciated that more channels than just two can be accommodated by extending the principle of multiple components shown in FIG. 2.

It should be understood that FIGS. 1 and 2 do not illustrate any particular device for holding the male and female parts together. Any suitable device can be used for this purpose. For example, the male connector part may be externally threaded, and there may be mounted on the female connector part an internally threaded cap which is rotatable with respect to the female part, but nevertheless which is secured thereto, as by cooperating flanges, for example. When the two parts of the connector are to be connected, the cap simply may be screwed to the male connector.

In the embodiment of the invention shown in FIG. 3 where the parts of the connector are rectangular in cross-section, so-called "pot" cores are employed to replace the cylindrical cores 15 and 24 of FIG. 1. A pot core simply is a disc of ferromagnetic material provided with an annular recess in which an annular winding is seated. In the embodiment of FIG. 3 a pot core also is provided for winding 18, and close coupling of windings 13 and 18 or 22 and 18 is achieved by means of a spring loaded ball 50 that bears against the part of male housing 12 containing core 15 when the connector parts are connected and against plug 21 when the connector parts are disconnected.

As indicated previously, plug 21 may be made movable other than by means of a spring. In the embodiment of FIG. 3 a magnet 31 is embedded in plug 21, another magnet being embedded in housing 12 in the place indicated. The magnets are poled to attract each other. Thus, when the male part is removed from the female part, it will automatically move plug 21 towards the open end of cavity 20. This movement will cease when stops on plug 21 and female housing 17 engage, at which point coil 22 will be inductively coupled with coil 18 by virtue of being located directly in line with it.

It also should be noted that magnet 32 may be an electromagnet. In this case movement of plug 21 can be controlled by controlling the supply of current to the electromagnet. Thus, if for some reason plug 21 is not to move to its normal position when the connector parts are disconnected, the electromagnet would not be energized.

Movement of plug 21 also may be by hydraulic or pneumatic means and may be automatic or not as desired.

Figure 4:
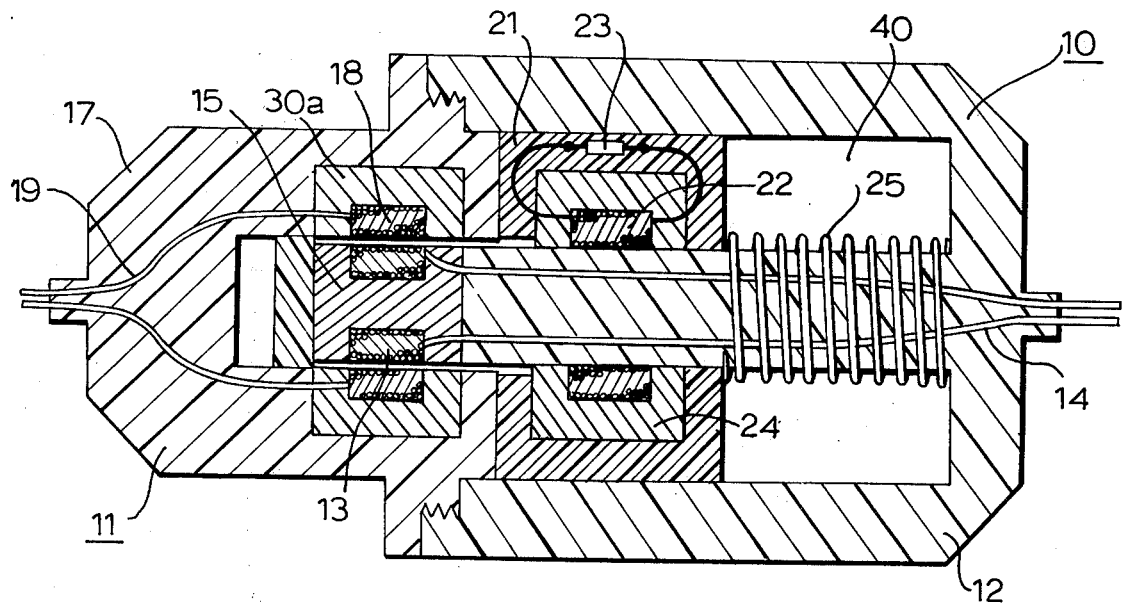

It also should be understood that plug 21 need not necessarily be associated with female part 11. It could be associated with male part 10 or, indeed, plugs 21 may be provided for both the male and female parts. In the embodiment of FIG. 4 plug 21 is associated with male part 10, and when the two parts of the connector are disconnected, spring 25 biases plug 21 so that coils 13 and 22 become inductively coupled, plug 21 moving, in this case, in an opening 40 provided in male part 10.

While all embodiments of the invention described herein have employed ferromagnetic cores, those skilled in the art will appreciate that such cores are not required at high frequencies and, consequently, can be eliminated in such applications. In such cases air cores or cores of other materials such as plastics can be employed.

In any embodiment of the invention where plug 21 is driven, as by a hydraulic or pneumatic force, with sufficient force to disconnect the two parts of the connector, the connector actually functions as a switch and can be so used.

What I claim as my invention is:

1. An inductive connector comprising first and second cooperating and separable parts, said parts being movable into a first cooperating position in which electrical energy can be inductively coupled between said parts and being separable from each other to interrupt the flow of electrical energy between said parts, said first part including first and second coils, said second part including a third coil, said first and third coils being constructed and arranged such that when said parts are in said first position, said first and third coils are inductively coupled, said second coil being movable into a position where it is inductively coupled with said first coil when said parts are separated from each other, an impedance connected in electrical circuit with said second coil, and means associated with said second part for moving said second coil out of inductively coupled relationship with said first coil when said parts are moved to said first position.

2. An inductive connector according to claim 1 including means for automatically moving said second coil into a position where it is inductively coupled with said first coil when said parts are separated.

3. An inductive connector according to claim 2 wherein said means for automatically moving is a spring.

4. An inductive connector according to claim 3 including movable plug means, said second coil being carried by said plug means, said spring biasing said plug means, and cooperating stop means on said plug means and on said first part for limiting movement of said plug means in the direction in which said spring biases said plug means to a position in which said first and second coils are inductively coupled when said parts are separated.

5. An inductive connector according to claim 1 including movable plug means, said second coil being carried by said plug means, said means for automatically moving comprising a first magnet carried by said plug and a second magnet carried by said means associated with said second part, said magnets being poled to attract each other and being drawn to each other when said parts are in said first position, whereby when said parts are separated, the attraction between said magnets moves said plug into a position where said first and second coils are inductively coupled.

6. An inductive connector according to claim 5 wherein one of said magnets is an electromagnet.

7. An inductive connector according to claim 5 including cooperating stop means on said plug means and on said first part for limiting movement of said plug means in the direction in which said plug means moves when said parts are separated to a position in which said first and second coils are inductively coupled when said parts are separated.

8. An inductive connector according to claim 1 including a first core of ferromagnetic material, said third coil being wound around at least a part of said first core.

9. An inductive connector according to claim 8 including a second core of ferromagnetic material, said second coil being wound around at least a part of said second core, said second core being movable with said second coil.

10. An inductive connector according to claim 9 including a third core of ferromagnetic material, said first coil being wound around at least a part of said third core.

11. An inductive connector according to claim 10 wherein said cores are pot cores.

12. An inductive connector according to claim 9 wherein said ferromagnetic material is ferrite.

13. An inductive connector according to claim 1 wherein said impedance is a resistor.

14. An inductive connector according to claim 1 wherein each of said coils has a longitudinal axis, said coils being constructed and arranged such that said longitudinal axes of all of said coils coincide when said parts are in said first position.

15. An inductive connector according to claim 14 wherein said second coil is movable to a position in which it is located coaxially within said first coil when said parts are separated.

16. An inductive connector according to claim 14 wherein said second coil is movable to a position where said first coil is located coaxially within said second coil when said parts are separated.

17. An inductive connector according to claim 1 wherein each of said coils has a longitudinal axis, said coils being constructed and arranged such that said longitudinal axes of said first and third coils coincide when said parts are in said first position, said second coil being spaced to one side of said first and third coils with its longitudinal axis parallel to the longitudinal axes of said first and third coils when said parts are in said first position, said second coil being movable into a position where its longitudinal axis coincides with the longitudinal axis of said first coil when said parts are separated.

18. An inductive connector according to claim 15 in which said third coil is located coaxially within said first coil when said parts are in said first position.

19. An inductive connector according to claim 16 wherein said first coil is located coaxially within said third coil when said parts are in said first position.

20. An inductive connector according to claim 1 wherein there are at least two of said first coils, two of said second coils, two of said third coils and two of said impedances, said first and third coils being constructed and arranged such that when said parts are in said first position one of said first coils is inductively coupled with one of said third coils and the other of said first coils is inductively coupled with the other of said third coils, said second coils being movable into positions where, when said parts are separated, one of said second coils is inductively coupled with one of said first coils and the other of said second coils is inductively coupled with the other of said first coils, one of said impedances being connected in electrical circuit with one of said second coils, the other of said impedances being connected in electrical circuit with the other of said second coils, said means associated with said second part being for moving said second coils out of inductively coupled relationship with said first coils when said parts are moved to said first position.

* * * * *